United States Patent
Matono et al.

(10) Patent No.: US 9,978,408 B1
(45) Date of Patent: May 22, 2018

(54) THIN-FILM PIEZOELECTRIC MATERIAL ELEMENT HAVING A SOLDER REGULATING PART FORMED ON A PAD SURFACE BEING A SURFACE OF AN ELECTRODE PAD

(71) Applicants: SAE Magnetics (H.K.) Ltd., Hong Kong (CN); KABUSHIKI KAISHA TOSHIBA, Tokyo (JP)

(72) Inventors: Naoto Matono, Hong Kong (CN); Kazushi Nishiyama, Hong Kong (CN); Hirofumi Nesori, Tokyo (JP); Takuma Kido, Tokyo (JP)

(73) Assignees: SAE MAGNETICS (H.K.) LTD., Hong Kong (CN); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days. days.

(21) Appl. No.: 15/351,669

(22) Filed: Nov. 15, 2016

(51) Int. Cl.
G11B 5/596 (2006.01)
G11B 21/10 (2006.01)
H01L 41/09 (2006.01)
H01L 41/29 (2013.01)
G11B 5/48 (2006.01)

(52) U.S. Cl.
CPC ............ *G11B 5/483* (2015.09); *G11B 5/4853* (2013.01); *G11B 5/596* (2013.01); *G11B 21/106* (2013.01); *H01L 41/096* (2013.01); *H01L 41/29* (2013.01)

(58) Field of Classification Search
None
See application file for complete search history.

(56) References Cited

U.S. PATENT DOCUMENTS 7,403,357 B1 * 7/2008 Williams ............. G11B 5/4853
360/245.9
2009/0091860 A1 * 4/2009 Dela Pena et al. .. G11B 5/4853
360/254

FOREIGN PATENT DOCUMENTS

| JP | 59-107769 | 6/1984 |
|---|---|---|
| JP | 2002-217609 | 8/2002 |
| JP | 2003-069208 | 3/2003 |
| JP | 2006-049777 | 2/2006 |
| JP | 2008-293636 | 12/2008 |
| JP | 2012-178195 | 9/2012 |
| WO | WO 2016/042928 | 3/2016 |

* cited by examiner

*Primary Examiner* — Craig A. Renner
(74) *Attorney, Agent, or Firm* — Nixon & Vanderhye PC

(57) ABSTRACT

A thin-film piezoelectric material element includes a piezoelectric part having a laminated structure which a lower electrode film, a piezoelectric material film and an upper electrode film are laminated sequentially, and electrode pads connected with the piezoelectric part. The thin-film piezoelectric material element has solder regulating parts formed on pad surfaces being surfaces of the electrode pads. The solder regulating parts have peripheral edge parts and crossing edge parts connected with the two outer edge parts, and formed to cross the pad surfaces. The crossing edge parts are formed in a bow like curve-shape having curved parts, being gradually distant from the shortest line as they are distant more from the outer edge parts.

8 Claims, 15 Drawing Sheets

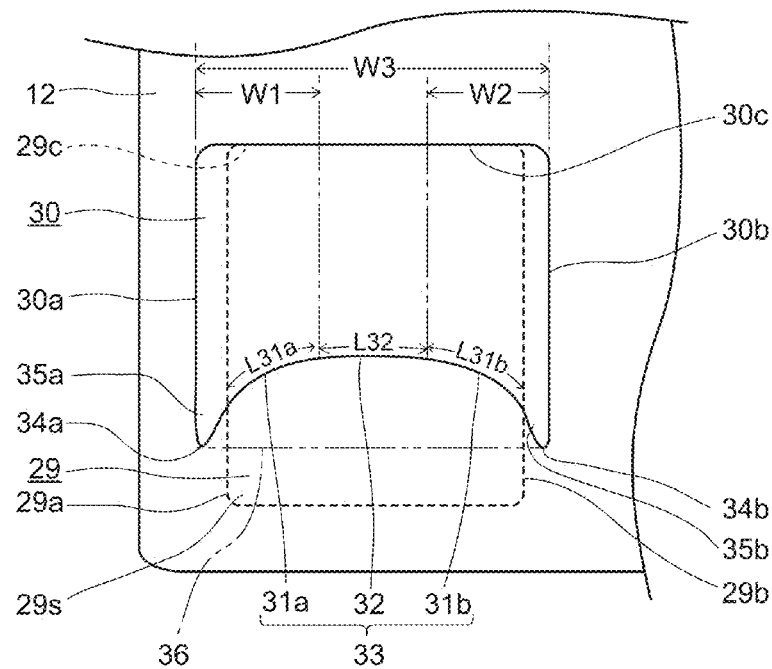

PRIOR ART $\alpha, \gamma < \beta$

PRIOR ART

THIN-FILM PIEZOELECTRIC MATERIAL ELEMENT HAVING A SOLDER REGULATING PART FORMED ON A PAD SURFACE BEING A SURFACE OF AN ELECTRODE PAD

BACKGROUND

Field of the Invention

The present invention relates to a thin-film piezoelectric material element which has a piezoelectric material and electrodes having thin-film like shape, a head gimbal assembly and a hard disk drive having the thin-film piezoelectric material element.

Related Background Art

A hard disk drive has a large recording capacity and is used as the heart of a storage device. The hard disk drive records and reproduces data to/from a hard disk (recording medium) by a thin-film magnetic head. A part, which the thin-film magnetic head is formed, is called as a head slider, and a part, which the head slider is mounted on the edge part, is a head gimbal assembly (will also be referred to as "HGA").

Further, recording and reproducing of data to/from the recording medium is performed by flying the head slider from a surface of the recording medium while rotating the recording medium, in the hard disk drive.

On the other hand, it has become difficult to control a position of the thin-film magnetic head accurately by control with only a voice coil motor (will also be referred to as "VCM"), because heightening a recording density of the recording medium has developed in company with increase of a capacity of the hard disk drive. Therefore, formerly, a technology, which an actuator having supplementary function (a supplementary actuator) is mounted on the HGA in addition to a main actuator with the VCM, and the supplementary actuator controls a minute position that is not able to be controlled by the VCM, is known.

A technology, which the main actuator and the supplementary actuator control the position of the thin-film magnetic head, is also called two stage actuator system (dual-stage system).

In the two stage actuator system, the main actuator makes drive arms rotate to decide a position of the head slider on a specific track of the recording medium. Further, the supplementary actuator adjusts the position of the head slider minutely so that the position of the thin-film magnetic head may become an optimum position.

A micro actuator using a thin-film piezoelectric material element is known formerly as the supplementary actuator. The micro actuator has the thin-film piezoelectric material element and the suspension supporting the thin-film piezoelectric material element, and the thin-film piezoelectric material element is mounted on the flexure of the suspension. Further, thin-film piezoelectric material element has a piezoelectric material and a pair of electrode films formed to sandwich the piezoelectric material, and each of them is formed to be a thin-film shape.

Further, for example, as disclosed in the JP 2012-178195 (referred to also as Patent Document 1), JP 2008-293636 (referred to also as Patent Document 2), electrode pads are formed in edge part of one side along the long-side direction in the conventional thin-film piezoelectric material element, the thin-film piezoelectric material element is electrically connected with the flexure via the electrode pads.

By the way, the electrode pads of the thin-film piezoelectric material element and the electrode pads formed on the flexure are connected by solder, when the thin-film piezoelectric material element is electrically connected with the flexure. In this point, for example, regulating parts, which control flow out of the solders, are formed in neighborhood of the electrode pads, in the thin-film piezoelectric material element disclosed in the Patent Document 1.

SUMMARY OF THE INVENTION

As mentioned in the above, the regulating parts, which control flow out of the solders, are formed in neighborhood of the electrode pads, in the thin-film piezoelectric material element disclosed in the Patent Document 1. Therefore, it is possible that the solders remain in desired parts of the electrode pads.

However, the following problems, caused by forms of the regulating parts, have not been solved, in the conventional thin-film piezoelectric material element.

The conventional regulating parts 300, disclosed in the Patent Document 1, have flat parts 301a, 301b, 301c formed flatly, and two curved parts 302a, 302b, which the corner parts are made gentle, as illustrated in FIG. 14(a). The conventional regulating parts 300 have mainly three flat parts 301a, 301b, 301c, and they have only forms which the corner parts, each flat part 301a, 301b, 301c intersecting, are curved gently.

Then, when soldering to the conventional electrode pads 303, illustrated in FIG. 14(a), is performed, the solders 304 in melting condition try to spread over in the outside. Therefore, as illustrated in FIG. 14(b), movements of the solders 304 (a part with diagonal lines in FIG. 14(b)) are regulated by the flat parts 301a, 301b, 301c and the curved parts 302a, 302b, the solders 304 receive pressure which they try to push back the solders 304.

However, because the solders 304, in melting condition, try to make the surface as small as possible so that surface energy might become minimum, the solders 304 do not flow easily into deep inside of the curved parts 302a, 302b, as compared with the other parts. Therefore, the pressures, which the solders 304 receive from the curved parts 302a, 302b, are smaller than the pressures which the solders 304 receive from the other parts (number of arrow schematically shows the size of the pressure, in FIG. 14(b)). Accordingly, as illustrated in FIG. 15(a), quantity of the solders 304, near the curved parts 302a, 302b, become smaller than quantity of the other part, so a wetness inferior part 304a (a part which wettability of solder declined) is sometimes formed.

Further, the solders 304 become states which Au is rich, Au is material of the electrode pads 303, therefore fragile phases are sometimes formed in the solders 304. In the boundary surfaces of the solders 304 and the electrode pads 303, solid phases, including both the solders 304 and the electrode pads 303 as each element, are formed by eutectic reaction (eutectic is referred to also as eutectic mixture). However, the solders 304 are hard to be supplied to the edge parts of solid phases because of the shrinkage which the solders 304 change from liquid phase to solid phase. Therefore, the boundary surfaces of the solders 304 and the electrode pads 303 do not change to enough eutectic, so the fragile phases are supposedly formed. If the fragile phases appear, a crack or shrinkage cavity get worse and there is the possibility which condition of the solders further deteriorate.

On the other hand, for example, as disclosed in the JPS 59-107769 (referred to also as Patent Document 3), JP 2006-49777 (referred to also as Patent Document 4), WO2016/042928 (referred to also as Patent Document 5), JP 2002-217609 (referred to also as Patent Document 6), JP 2003-69208 (referred to also as Patent Document 7), there are conventional technologies which the regulating parts are formed to suppress flow out of the solder, in the different technical fields, such as a semiconductor device or the like, from the thin-film piezoelectric material element.

However, the conventional regulating parts are only the parts which the corner parts, a plurality of flat parts intersect, are curved gently or formed in a bar like shape. Therefore, it is difficult that reliability of connecting condition is enhanced, in the parts which electrode pads of both the thin-film piezoelectric material elements and the flexure are connected by the solders (referred to also solder connecting parts), even if the conventional technologies, in the different technical fields from the thin-film piezoelectric material element, are applied.

Hence, the present invention is made to solve the above problem, and its object is to enhance the reliability of connecting condition in the parts which electrode pads of both the thin-film piezoelectric material elements and the flexure are connected by the solders, in the thin-film piezoelectric material element, the head gimbal assembly and the hard disk drive having the thin-film piezoelectric material element.

To solve the above problem, the present invention is a thin-film piezoelectric material element including: a piezoelectric part; and electrode pads being connected with the piezoelectric part, the piezoelectric part includes a laminated structure which a lower electrode film, a piezoelectric material film and an upper electrode film are laminated sequentially; the thin-film piezoelectric material element includes solder regulating parts formed on pad surfaces being surfaces of the electrode pads; the solder regulating parts includes peripheral edge parts arranged in outermost parts; and crossing edge parts connected with two outer edge parts, and formed so as to cross the pad surfaces, the two outer edge parts are two edge parts of the peripheral edge parts and arranged in the outside than the pad surfaces, the crossing edge parts are formed in a bow like curve-shape having curved parts, being gradually distant from the shortest lines which connects the one outer edge part with the other outer edge part along with the direction narrowing the solder regulating parts as they are distant more from the outer edge parts.

In the above-described thin-film piezoelectric material element, it is possible that the pad surfaces are formed in approximately rectangular shapes, the crossing edge parts have flat parts formed along short-side edge parts of the pad surfaces, the curved parts are formed respectively in both sides of the flat parts, and about both the curved parts, the length of parts on the pad surfaces are equal or larger than the length of the flat parts.

Further, it is preferable that the solder regulating parts have protruding tips respectively surrounded by the peripheral edge part, the outer edge part and the curved part, the protruding tips are arranged in the outside than the pad surfaces, and formed approximately along long-side edge parts of the pad surfaces.

Further, it is possible that the curved parts are formed so that the parts on the pad surfaces have size which the radius of curvature is less than 100 μm.

Furthermore, it is preferable that the peripheral edge parts includes two outside arranged parts formed along long-side edge parts of the pad surfaces and arranged in the outside than the long-side edge parts, and connecting parts which connects the one outside arranged part and the other outside arranged part, and formed along the short-side edge parts.

Then, the present invention provides a head gimbal assembly including a head slider having a thin-film magnetic head; a suspension for supporting the head slider; and a thin-film piezoelectric material element for displacing the head slider relatively to the suspension; the thin-film piezoelectric material element including: a piezoelectric part; and electrode pads being connected with the piezoelectric part, the piezoelectric part includes a laminated structure which a lower electrode film, a piezoelectric material film and an upper electrode film are laminated sequentially; the thin-film piezoelectric material element includes solder regulating parts formed on pad surfaces being surfaces of the electrode pads; the solder regulating parts includes peripheral edge parts arranged in outermost parts; and crossing edge parts connected with two outer edge parts, and formed so as to cross the pad surfaces, the two outer edge parts are two edge parts of the peripheral edge parts and arranged in the outside than the pad surfaces, the crossing edge parts are formed in a bow like curve-shape having curved parts, being gradually distant from the shortest lines which connects the one outer edge part with the other outer edge part along with the direction narrowing the solder regulating parts as they are distant more from the outer edge parts.

Further, the present invention provides a hard disk drive including a head gimbal assembly including a head slider having a thin-film magnetic head, a suspension for supporting the head slider, a thin-film piezoelectric material element for displacing the head slider relatively to the suspension; and a recording medium; the thin-film piezoelectric material element including: a piezoelectric part; and electrode pads being connected with the piezoelectric part, the piezoelectric part includes a laminated structure which a lower electrode film, a piezoelectric material film and an upper electrode film are laminated sequentially; the thin-film piezoelectric material element includes solder regulating parts formed on pad surfaces being surfaces of the electrode pads; the solder regulating parts includes peripheral edge parts arranged in outermost parts; and crossing edge parts connected with two outer edge parts, and formed so as to cross the pad surfaces, the two outer edge parts are two edge parts of the peripheral edge parts and arranged in the outside than the pad surfaces, the crossing edge parts are formed in a bow like curve-shape having curved parts, being gradually distant from the shortest lines which connects the one outer edge part with the other outer edge part along with the direction narrowing the solder regulating parts as they are distant more from the outer edge parts.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 6 is a plan view showing the part of the thin-film piezoelectric material element, with enlargement, which electrode pads are formed;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of HGA)

Figure 1:
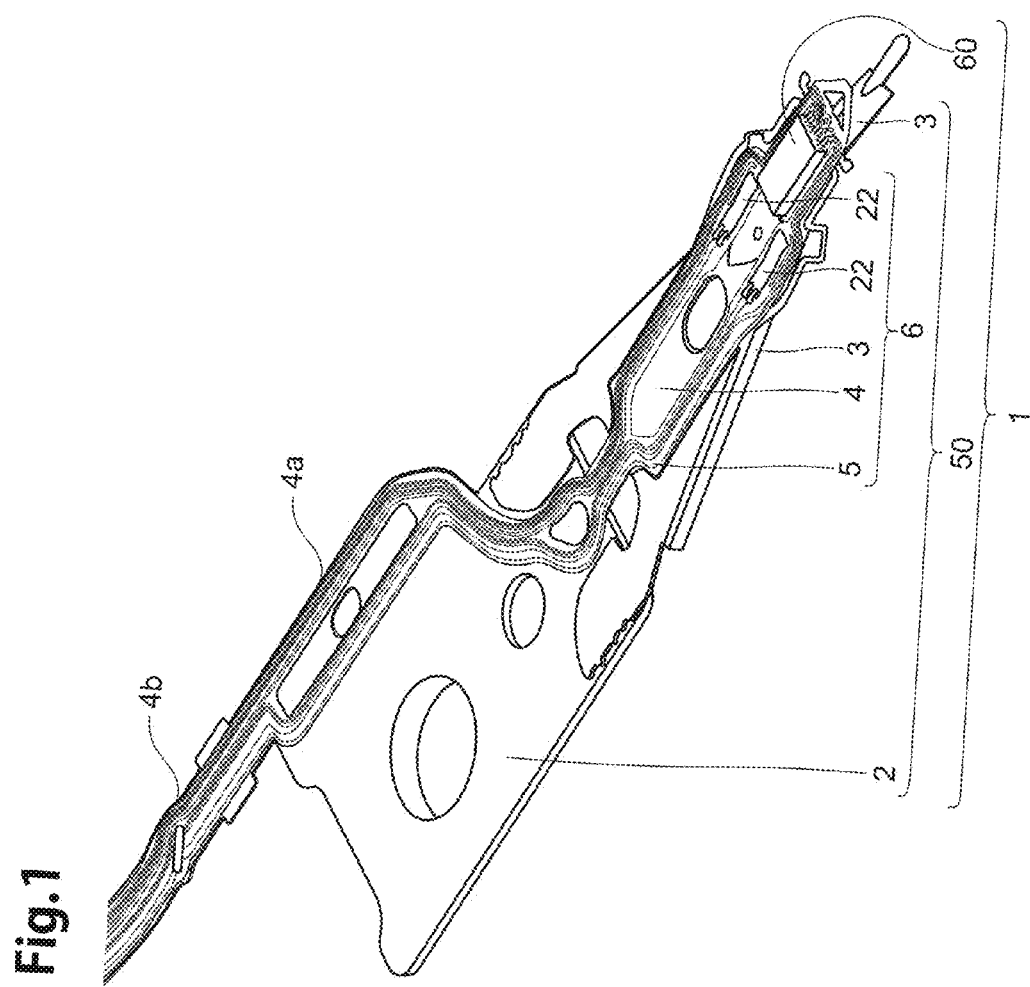
FIG. 1 is a perspective view showing a whole of the HGA, from front side, according to an embodiment of the present invention.
Figure 2:
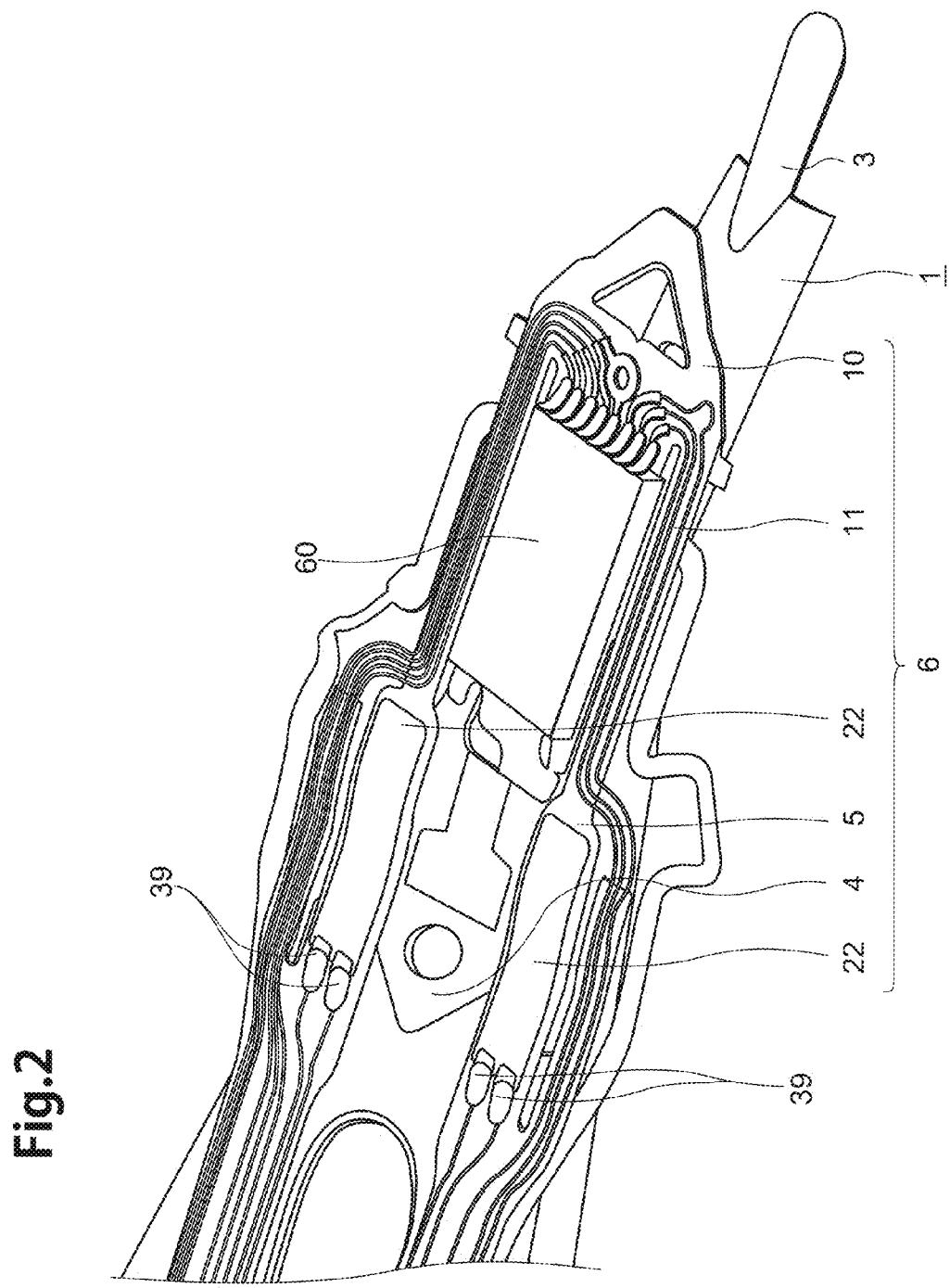
FIG. 2 is a perspective view showing, from front side, a principal part of the HGA in FIG. 1.
Figure 3:
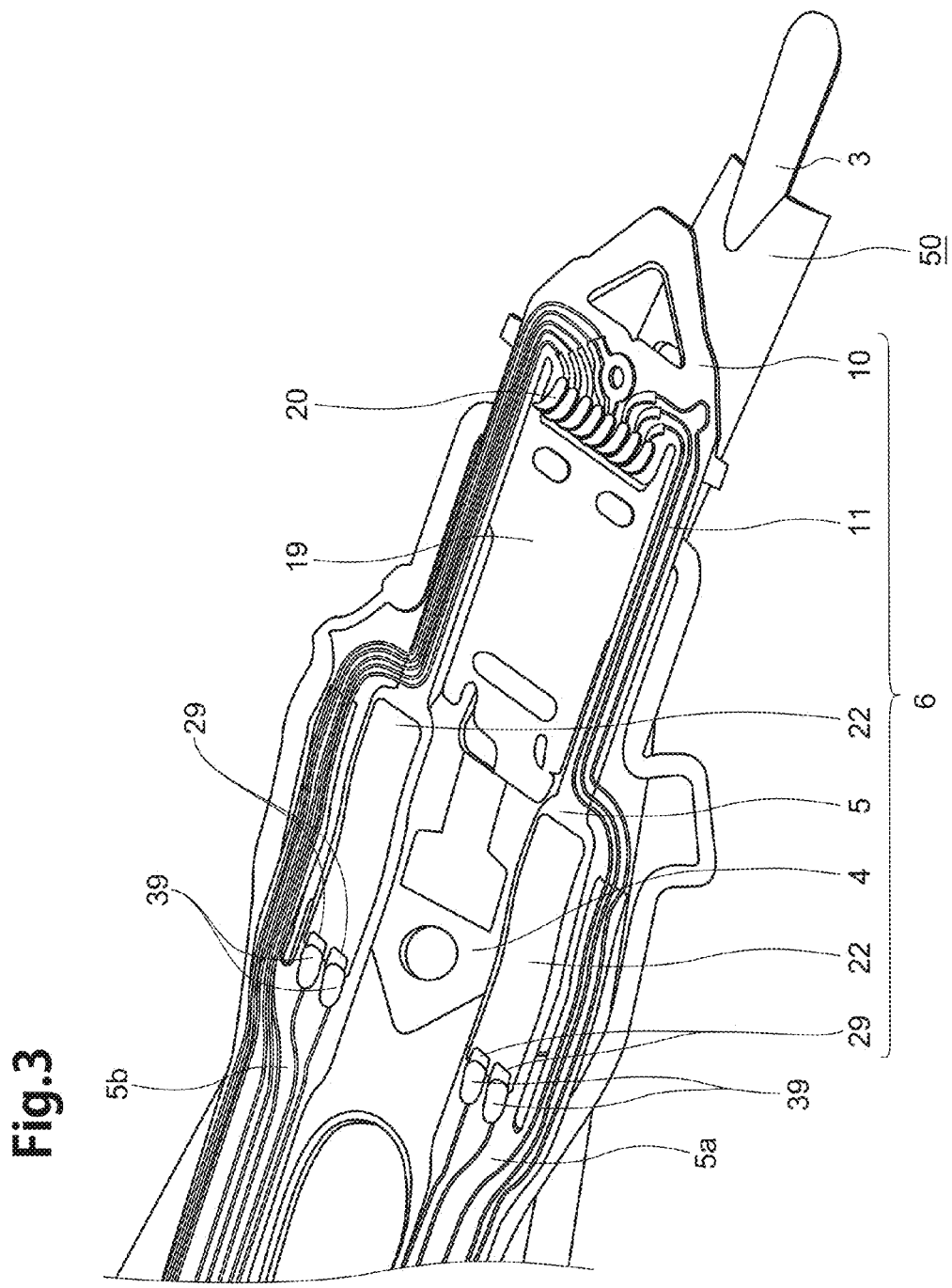
FIG. 3 is a perspective view showing a principal part of a suspension constituting the HGA in FIG. 1 from front side.
Figure 4:
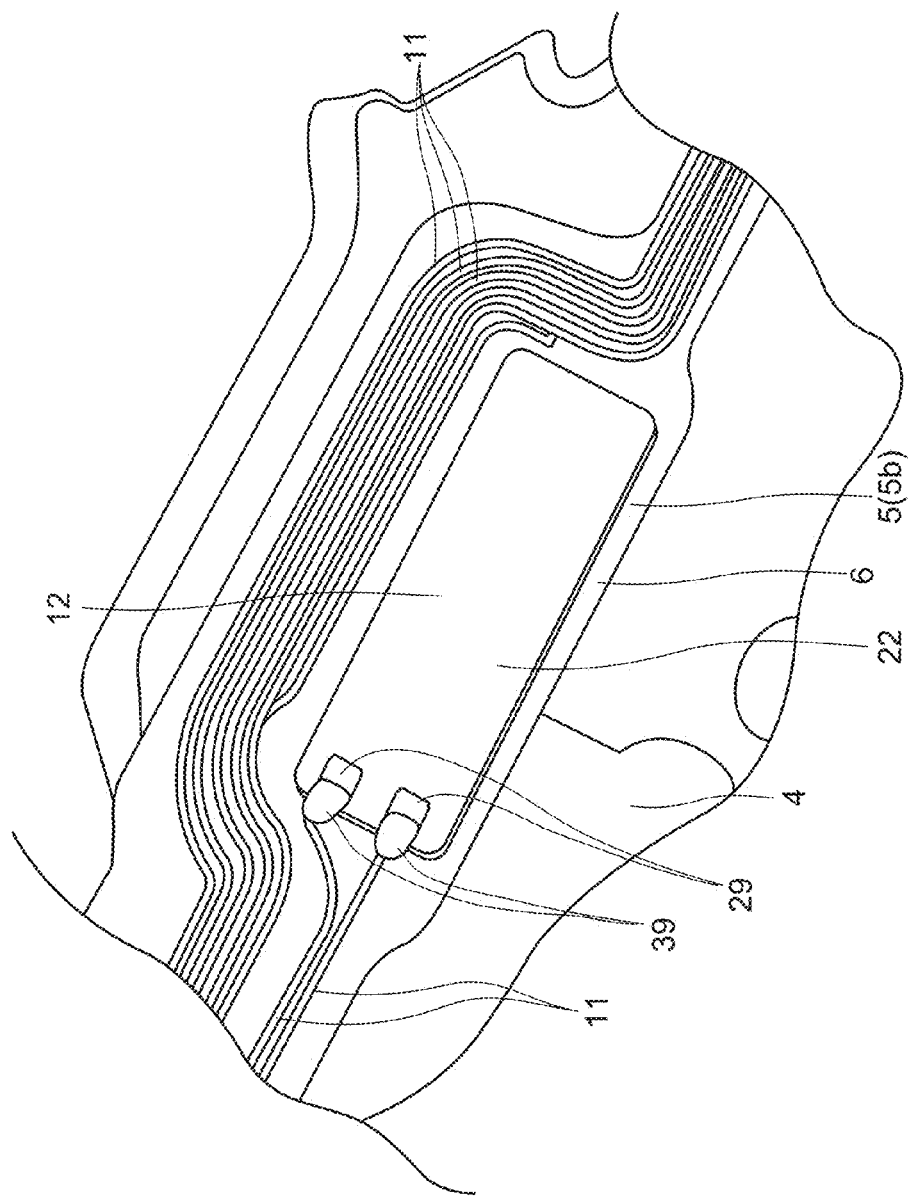
FIG. 4 is a perspective view showing a part of flexure, with enlargement, which a thin-film piezoelectric material element is fixed.

To begin with, a structure of the HGA according to the embodiment of the present invention will be explained with reference to FIG. 1 to FIG. 4. Here, FIG. 1 is a perspective view showing a whole of the HGA 1, from front side, according to an embodiment of the present invention. FIG. 2 is a perspective view showing a principal part of the HGA 1 from front side. FIG. 3 is a perspective view showing a principal part of a suspension 50 constituting the HGA 1 from front side. FIG. 4 is a perspective view showing a part of a flexure 6, with enlargement, which a thin-film piezo-electric material element 22 is fixed.

As illustrated in FIG. 1, the HGA 1 has the suspension 50 and a head slider 60. The suspension 50 has a base plate 2, a load beam 3, the flexure 6 and a dumper not illustrated, and it has a structure which these parts are joined to be united one body by a weld and so on.

The base plate 2 is a part which is used to fix the suspension 50 to a drive arms 209 of a later-described hard disk drive 201, and it is formed with a metal such as stainless steel or the like.

The load beam 3 is fixed on the base plate 2. The load beam 3 has a shape in which the width gradually decreases as it is distanced more from the base plate 2. The load beam 3 has a load bending part which generates a power for pressing the head slider 60 against the later-described hard disk 202 of the hard disk drive 201.

Further, as illustrated in FIG. 1 to FIG. 4, the flexure 6 has a flexure substrate 4, a base insulating layer 5, a connecting wiring 11 and thin-film piezoelectric material elements 22, 22, and further it has a later-described protective insulating layer 25. The flexure 6 has a structure which the base insulating layer 5 is formed on the flexure substrate 4, the connecting wiring 11 and the thin-film piezoelectric material elements 22, 22 are adhered on the base insulating layer 5. Further, the protective insulating layer 25 is formed so as to cover the connecting wiring 11 and the thin-film piezoelectric material elements 22, 22.

The flexure 6 has a piezoelectric elements attached structure which the thin-film piezoelectric material elements 22, 22 are fixed on the surface of the base insulating layer 5 in addition to the connecting wiring 11 to become a structure with the piezoelectric elements.

Further, the flexure 6 has a gimbal part 10 on the tip side (load beam 3 side). A tongue part 19, which the head slider 60 is mounted, is secured on the gimbal part 10, and a plurality of connecting pads 20 are formed near an edge side than the tongue part 19. The connecting pads 20 are electrically connected to not-illustrated electrode pads of the head slider 60.

This flexure 6 expands or shrinks the thin-film piezoelectric material elements 22, 22 and expands or shrinks stainless parts (also referred to out trigger parts) jut out outside of the tongue part 19. That makes a position of the head slider 60 move very slightly around a not-illustrated dimple, and a position of the head slider 60 is controlled minutely.

The flexure substrate 4 is a substrate for supporting a whole of the flexure 6, and it is formed with stainless. Rear side of the flexure substrate 4 is fixed to the base plate 2 and the load beam 3 by weld. As illustrated in FIG. 1, the flexure substrate 4 has a center part 4a fixed to surfaces of the load beam 3 and the base plate 2, and a wiring part 4b extending to outside from the base plate 2.

The base insulating layer 5 covers s surface of the flexure substrate 4. The base insulating layer 5 is formed with for example polyimide, epoxy resin (besides, acrylic resin, fluorine-contained polymers, benzocyclobutene (BCB) resin are able to be used), and it has a thickness of about 5 μm to 10 μm. Further, as illustrated in detail in FIG. 3, a part of the base insulating layer 5, disposed on the load beam 3, is divided two parts. One part of them is a first wiring part 5a, the other part of them is second wiring part 5b. The thin-film piezoelectric material element 22 is adhered on surface of each wiring part.

A plurality of connecting wirings 11 are formed on surfaces of each of the first wiring part 5a and the second wiring part 5b. Each connecting wiring 11 is formed with conductor such as copper or the like. One end parts of each connecting wiring 11 are connected with the thin-film piezoelectric material element 22 or each connecting pad 20.

The protective insulating layer 25 is formed with, for example, polyimide, epoxy resin. The protective insulating layer 25 has a thickness of about 1 μm to 10 μm, for example.

Further, a not illustrated thin-film magnetic head, which records and reproduces data, is formed on the head slider 60. Furthermore, a plurality of not illustrated electrode pads are formed on the head slider 60, and each electrode pad is connected with the connecting pad 20.

(Structure of Thin-Film Piezoelectric Material Element)

Figure 5:
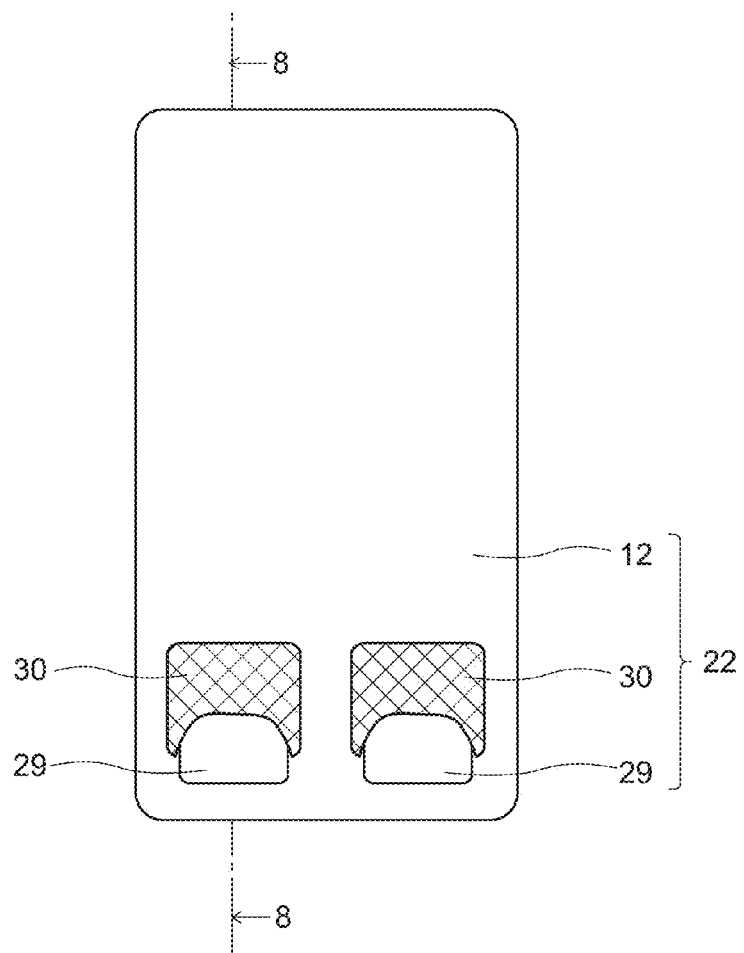
FIG. 5 is a plan view of the thin-film piezoelectric material element.
Figure 7A:
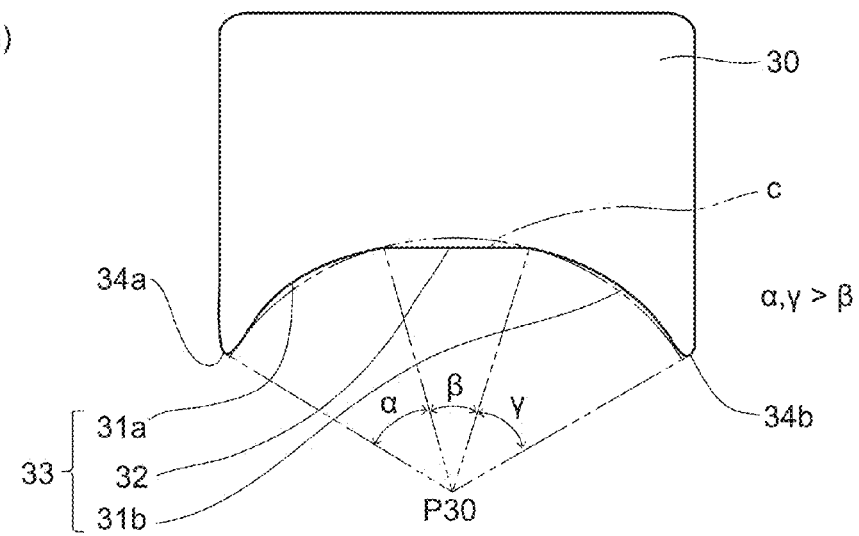
FIG. 7(a) is a plan view showing solder regulating parts formed on the electrode pads.
Figure 7B:
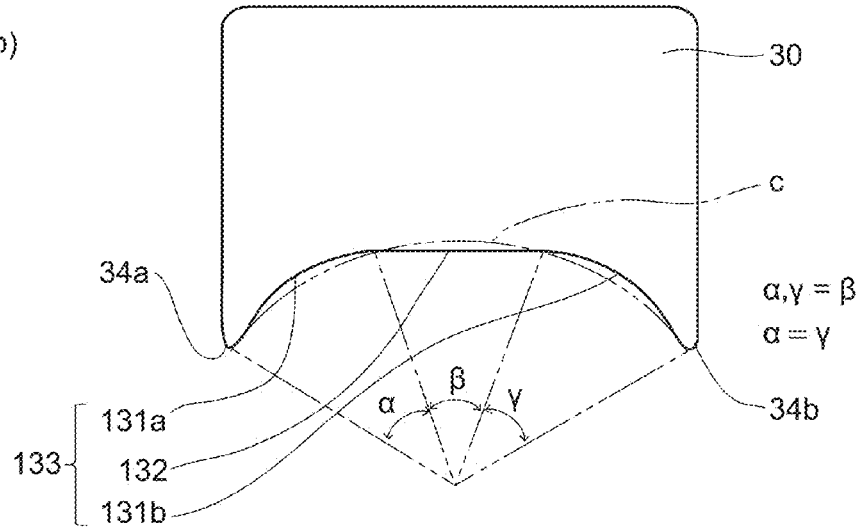
FIG. 7(b) is a plan view showing the solder regulating parts according to a modified example.
Figure 8:
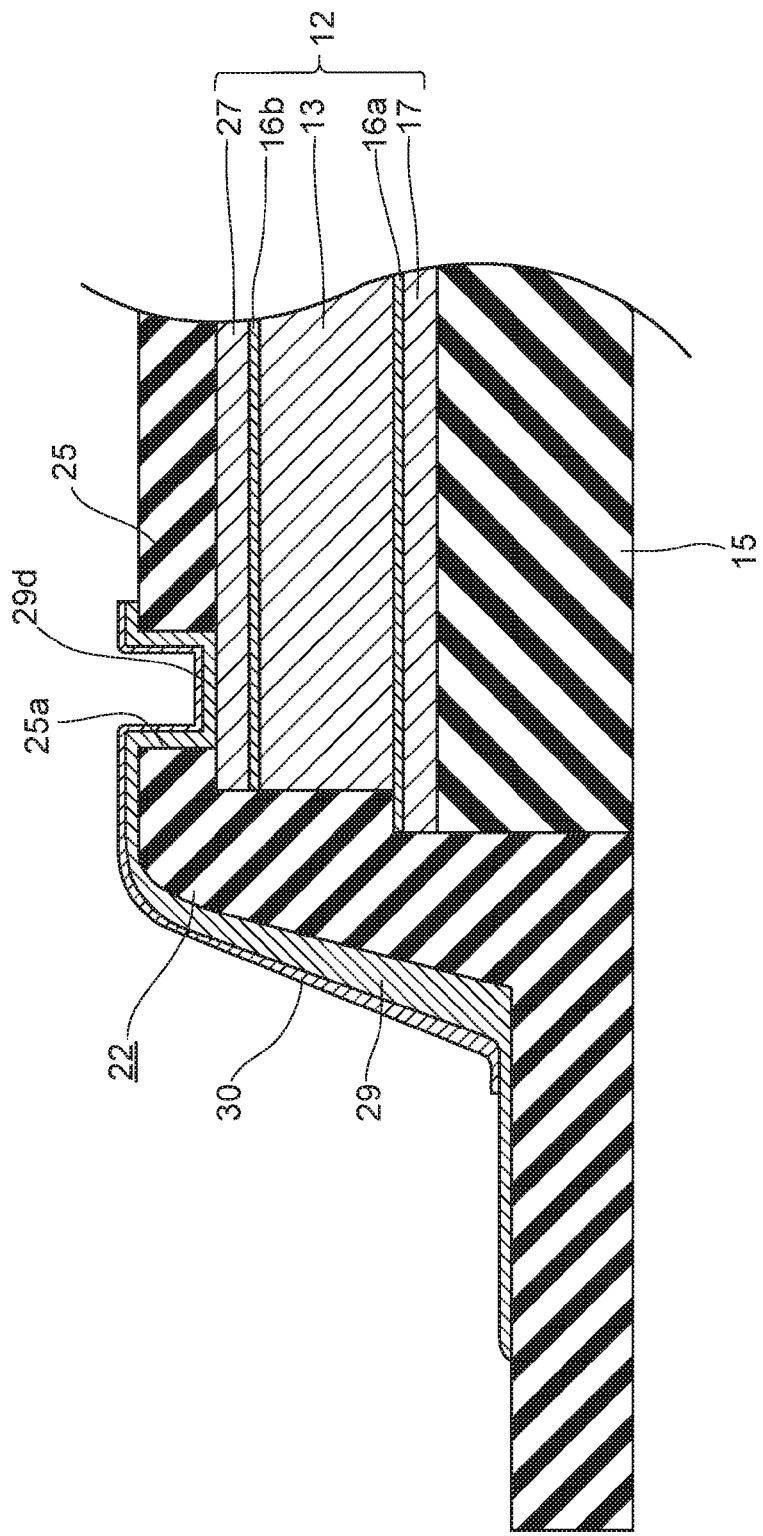
FIG. 8 is a sectional view taken along the line 8-8 in FIG. 5.
Figure 9:
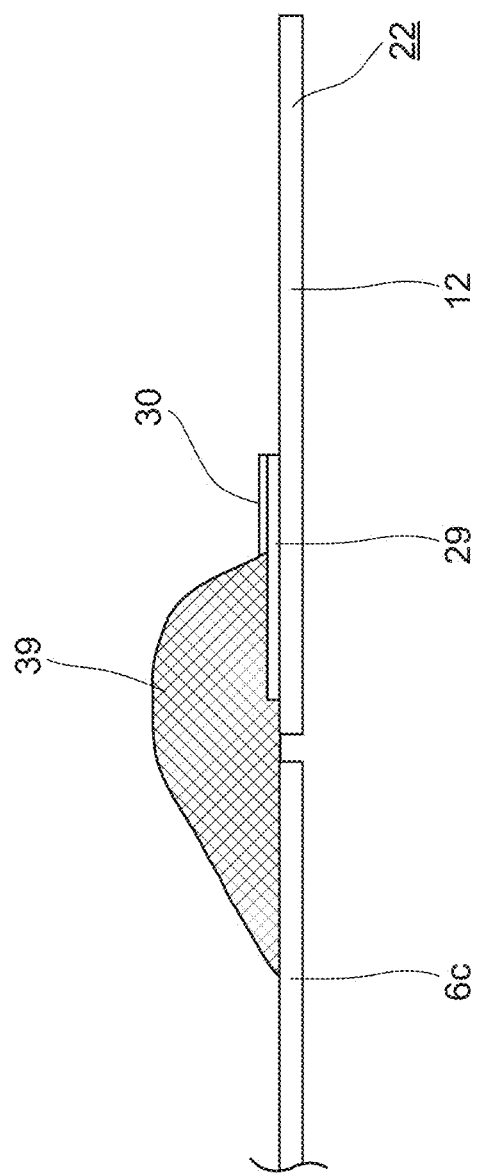
FIG. 9 is a side elevation view schematically showing a connecting part of the thin-film piezoelectric material element 22 and electrode pads of the flexure 6.

Subsequently, the structure of thin-film piezoelectric material element 22 will be explained with reference to FIG. 5 to FIG. 9. Here, FIG. 5 is a plan view showing the thin-film piezoelectric material element 22. FIG. 6 is a plan view showing the part of the thin-film piezoelectric material element 22, with enlargement, which electrode pads 29 are formed. FIG. 7(a) is a plan view showing solder regulating parts 30 formed on the electrode pads 29, FIG. 7(b) is a plan view showing the solder regulating parts 30 according to a modified example. FIG. 8 is a sectional view taken along the line 8-8 in FIG. 5. FIG. 9 is a side elevation view schematically showing a connecting part of the thin-film piezoelectric material element 22 and electrode pads of the flexure 6.

The thin-film piezoelectric material element 22 has a piezoelectric part 12, which is formed in an approximately rectangular shape in the plan view, electrode pads 29, 29 and solder regulating parts 30, 30. One pair of electrode pads 29, 29 are formed along with short side part of one side of the long side direction in the piezoelectric part 12, and the solder regulating parts 30, 30 are formed for respective electrode pads 29, 29.

The electrode pads 29, 29 are made of metal having good conductivity such as Au or the like, and they are thin-films which pad surfaces 29s, being their surfaces, are formed in approximately rectangular shapes. The electrode pads 29, 29 are connected respectively with a later-described lower electrode film 17, an upper electrode film 27 of the piezoelectric part 12.

The electrode pad 29, formed on the left side illustrated in FIG. 5, is connected with the upper electrode film 27, the electrode pad 29, formed on the right side, is connected with the lower electrode film 17, in the thin-film piezoelectric material element 22 according to this embodiment. The electrode pad 29 formed on the left side has an embedded part 29d, as illustrated in FIG. 8. The embedded part 29d is connected with the upper electrode film 27 in a through hole 25a of the protective insulating layer 25. The electrode pad 29 formed on the right side has also the embedded part, as not illustrated, the embedded part is connected with the lower electrode film 17 in the through hole 25a.

The solder regulating parts 30 are formed of metal such as Ti or the like. The solder regulating parts 30 are formed so that they cover respectively parts of the pad surfaces 29s (approximately about 50-60%), being surface of each electrode pad 29. Parts with cross-hatching represents the solder regulating parts 30, in FIG. 5.

The solder regulating parts 30 have peripheral edge parts 30a, 30b, 30c, arranged in outermost parts and crossing edge parts 33, as illustrated in FIG. 6. The peripheral edge parts 30a, 30b, 30c are formed along with the periphery of the pad surfaces 29s.

Because the pad surfaces 29s are formed in approximately rectangular shapes, the peripheral edge parts 30a, 30b, 30c are formed in approximately C-figure shapes along with three parts (long-side edge parts 29a, 29b, short-side edge part 29c) surrounding the pad surfaces 29s, in the thin-film piezoelectric material element 22 according to the embodiment.

Further, the whole peripheral edge parts 30a, 30b are arranged in the outside than the long-side edge parts 29a, 29b of the pad surfaces 29s. About the whole of peripheral edge part 30c is arranged in the same position with the short-side edge part 29c (the position overlaid with the short-side edge part 29c). The peripheral edge parts 30a, 30b correspond to outside arranged parts according to the embodiment of the present invention. Because the peripheral edge part 30c connects the peripheral edge part 30a and the peripheral edge part 30b, and the peripheral edge part 30c is formed along with the short-side edge part 29c, the peripheral edge part 30c corresponds to a connecting part according to the embodiment of the present invention. Further, two edge parts of the peripheral edge parts 30a, 30b, on the side not connected with the peripheral edge parts 30c, are outer edge parts 34a, 34b. The outer edge parts 34a, 34b are arranged in the outside than the pad surfaces 29s.

The crossing edge parts 33 are connected with the two outer edge parts 34a, 34b, and they are formed to cross the pad surfaces 29s. The parts, connected with the outer edge parts 34a, 34b, of the crossing edge parts 33 are curved parts 31a, 31b having approximate arc shape. Flat parts 32, formed flatly (along with the peripheral edge parts 30c), are arranged between the curved parts 31a and the curved parts 31b.

The curved parts 31a, 31b curve so that they are gradually distant from shortest lines 36 along with the direction narrowing the solder regulating parts 30 as they are distant more from the respective outer edge parts 34a, 34b. Here, the shortest lines 36 mean the imaginary shortest lines which connects the outer edge part 34a with the outer edge part 34b. The crossing edge parts 33 has the two curved parts 31a, 31b and the flat parts 32, thereby they are formed in a form warped in a bow shape with a receding direction from the shortest lines 36 (referred to also as a bow like curve-shape, arch-shape, in this embodiment) as a whole.

On both sides of not bending parts (the flat parts 32), the bending parts (the curved parts 31a, 31b) are arranged, in the crossing edge parts 33. Ratio of the later (the curved parts 31a, 31b) is larger than the ratio of the former (the flat parts 32). Therefore, the crossing edge parts 33 are formed of approximately curved surfaces even if they have the flat parts 32, and they curve in a bow like shape, as a whole. Further, concerning the length L32 of the flat parts 32 and the lengths L31a, L31b of the parts arranged on the pad surfaces 29s of the curved parts 31a, 31b, the crossing edge parts 33 are formed so that the sum of L31a and L31b is equal or more than L32 (L31a+L31b≥L32).

Further, for example, W1, W2 are able to be about 30 μm, W3 are able to be about 86 μm, in FIG. 6. Further, the crossing edge parts 33 are able to be formed so that respective the parts arranged on the pad surfaces 29s of curved parts 31a, 31b (the above-described parts corresponding to the lengths L31a, L31b), are able to be formed in shapes having size which the radius of curvature is less than 100 μm.

Note that a curved surface along to a semicircle is supposed as a curved surface which connects the outer edge part 34a with the outer edge part 34b, as not illustrated though, the radius of curvature of the curved parts 31a, 31b are smaller than the radius of curvature of the curved surface.

Then, concerning the crossing edge parts 33, as illustrated in FIG. 7(a), curved surface c, on an arc passing through the outer edge parts 34a, 34b, is supposed though, the crossing edge parts 33 do not correspond perfectly to the curved surface c. Further, as illustrated in FIG. 7(a), when a central point P30 is supposed to set angles of the respective curved part 31a, flat part 32 and curved part 31b as respectively α, β, γ, the angle β of the flat part 32 is smaller than the angles α, γ of the curved parts 31*a*, 31*b*.

The solder regulating parts 30 may have crossing edge parts 133 instead of the crossing edge parts 33, as illustrated in FIG. 7(*b*). The crossing edge parts 133 have curved parts 131*a*, 131*b* and flat parts 132. The angles α, γ of the curved parts 131*a*, 131*b* almost correspond to the angles β of the flat parts 132. The lengths of the flat parts 132 are longer than those of the flat parts 32. The lengths of the curved parts 131*a*, 131*b* are shorter than those of the curved parts 31*a*, 31*b*. In such the crossing edge parts 133, the ratio of the flat parts 132 are smaller than those of the curved parts 131*a*, 131*b*, and the curved parts 131*a*, 131*b* are connected with the outer edge parts 34*a*, 34*b*. The crossing edge parts 133 also curves in a bow like shape as a whole, similar with the crossing edge parts 33.

Here, return back to the FIG. 6, the solder regulating parts 30 have two protruding tips 35*a*, 35*b*. The protruding tips 35*a* are projection parts having approximately triangle shapes being surrounded by the peripheral edge part 30*a*, the outer edge part 34*a* and the curved part 31*a*. The protruding tips 35*b* are projection parts having an approximately triangle shapes being surrounded by the peripheral edge part 30*b*, the outer edge part 34*b* and the curved part 31*b*. Both of the protruding tips 35*a* and protruding tips 35*b* are formed along with the long-side edge parts 29*a*, 29*b* of the pad surfaces 29*s*.

(Structure of Piezoelectric Part)

Next, when the structure of the piezoelectric part 12 will be explained, it is as the following. The piezoelectric part 12, as illustrated in detail in FIG. 8, has the lower electrode film 17, a lower adhesive film 16*a*, a piezoelectric material film 13, an upper adhesive film 16*b* and the upper electrode film 27, and it has a laminated structure which each film is piled up in order.

Note that "upper" and "lower" in the present invention do not show necessarily upper side, lower side in a condition which the thin-film piezoelectric material element is adhered on the base insulating layer 5. These words are terms for reasons of convenience so as to distinguish two electrode films and so on opposing each other sandwiching the piezoelectric material film 13 between them. In the actual products, the upper electrode film 27 and the upper adhesive film 16*b* are sometimes disposed lower side, and the lower electrode film 17 and the lower adhesive film 16*a* are sometimes disposed upper side.

The piezoelectric material film 13 is formed to be a thin-film shape using a piezoelectric material such as lead zirconate titanate ((Pb (Zr,Ti) $O_3$) which will also be referred to as "PZT" in the following) or the like. The piezoelectric material film 13 is formed by epitaxial growth and it has a thickness of about 2 μm to 5 μm. A piezoelectric ceramics (much of them are ferroelectric substance) such as barium titanate, lead titanate or the like, non-lead system piezoelectric ceramics not including titanium or lead are able to be used for the piezoelectric material film 13 instead of using PZT.

The lower electrode film 17 is, for example, a polycrystalline thin-film (thickness about 150 nm) made of metal element which has Pt (it may include Au, Ag, Pd, Ir, Rh, Ni, Pb, Ru, Cu, in addition to Pt) as main ingredient, it is formed on a supporting layer 15.

The lower adhesive film 16*a* is, for example, a thin-film (thickness about 35 nm) made of conductive material such as $SrRuO_3$ or the like, and it is formed on the lower electrode film 17.

The upper adhesive film 16*b* is, for example, a thin-film (thickness about 20 nm) made of conductive material formed by epitaxial growth such as $SrRuO_3$ (referred to also as SRO) or the like, and it is formed on the upper surface of the piezoelectric material film 13.

The upper electrode film 27 is, for example, a thin-film (thickness about 100 nm) made of metal material which has Pt (it may include Au, Ag, Pd, Ir, Ru, Cu, in addition to Pt) as main ingredient, it is formed on the upper adhesive film 16*b*.

The upper electrode film 27, the lower electrode film 17 are respectively connected with the electrode pads 29, 29. As mentioned above, the upper electrode film 27 is connected with the electrode pad 29 on the left side, the lower electrode film 17 is connected with the electrode pad 29 on the right side.

The protective insulating layer 25 covers all the surfaces of the thin-film piezoelectric material element 22, thin-film piezoelectric material element 22. The protective insulating layer 25 is formed with polyimide, epoxy resin, for example, and it has a thickness of about 1 μm to 10 μm.

(Operation and Effect of Thin-Film Piezoelectric Material Element)

In the above-described thin-film piezoelectric material element 22, when the solders 39 are applied to connect the electrode pads 29 and the electrode pads 6*c* of the flexure 6, the solders 39 flow and spread on the electrode pads 29 before hardening.

Figure 10:
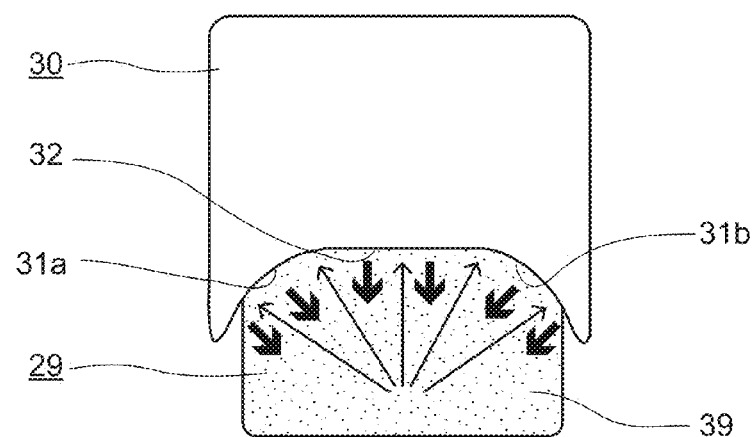
FIG. 10 is a view showing movement of the solders when soldering, for the solder regulating parts and electrode pads in FIG. 6, is performed.

However, the solder regulating parts 30 are formed to cover the pad surfaces 29*s* of the electrode pads 29, and the solder regulating parts 30 have the crossing edge parts 33, as mentioned above. Surface parts of the solders 39, in melting condition before hardening, become globular shape easily because of its surface tension. Because the crossing edge parts 33 are formed in a bow like curve-shape, having the curved parts 31*a*, 31*b* and the flat part 32, the crossing edge parts 33 have formations suitable for the surfaces of the solders 39 in melting condition. Therefore, when the solders 39 in melting condition try to flow and spread, although the movements are regulated by the crossing edge parts 33, the solders 39 receive approximately equivalent pressure from each part (the curved parts 31*a*, 31*b* and the flat part 32, narrow arrows schematically represent movements of the solders 39, wide arrows schematically represent the size of pressure by the crossing edge parts 33, in FIG. 10).

After that, the applied solders 39 are hardened to connect the electrode pads 29 and the electrode pads 6*c* of the flexure 6, as illustrated in FIG. 9. However, in case of the solders 39 after hardening, unevenness of quantity does not appear because of the above-described reason. Therefore, wetness inferior, in the solders 39, does not appear. Accordingly, reliability of connecting condition, in the solder connecting parts concerning the electrode pads 29 and the electrode pads 6*c* of the flexure 6, is able to be enhanced, in the thin-film piezoelectric material element 22.

Further, because unevenness of quantity concerning the solders 39 does not appear, the Au rich part in company with supply decreasing of the solders 39, Au is material for electrode pads 29, does not appear. Accordingly, a fragile phase because of Au rich does not appear, reliability of connecting condition, in the solder connecting parts, is further enhanced.

Figure 12:
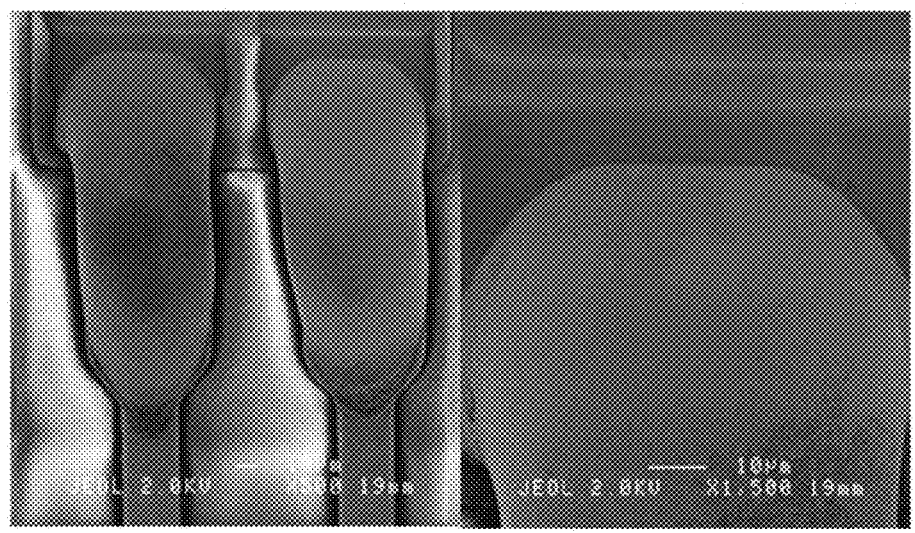
FIG. 12 is a SEM image showing one example of connecting part of the thin-film piezoelectric material element according to the embodiment of the present invention and the electrode pads of the flexure.

Then, when the thin-film piezoelectric material elements 22, having the solder regulating parts 30, are formed, solder is applied to connect the electrode pads and the electrode pads of the flexure, the connecting parts shown in FIG. 12 are obtained. FIG. 12 is a SEM image showing one example of connecting parts of the thin-film piezoelectric material element according to the embodiment of the present invention and electrode pads of the flexure. As illustrated in FIG. 12, movements of the solders are regulated by the solder regulating parts, the appearances of the surfaces are formed in a spherical surface shape.

To the contrary of the above, as described-above, the conventional solder regulating parts 300 have shapes having flat parts 301a, 301b, 301c and curved parts 302a, 302b, the curved parts 302a, 302b have only forms which the corner parts, flat parts 301a, 301b, 301c intersecting are curved gently. Because the angle β of the flat part 301b is larger than the angles α, γ of the curved parts 302a, 302b in the conventional solder regulating parts 300, the conventional solder regulating parts 300 do not provide operation and effect like the solder regulating parts 30.

On the other hand, the solder regulating parts 30 have the two protruding tips 35a, 35b. The protruding tips 35a, 35b regulate the movements of the solders 39, trying to flow out outside from the long-side edge parts 29a, 29b of the electrode pads 29, and exhibit operation which they retain the solders 39 on the pad surfaces 29s. Therefore, reliability of connecting condition in the solder connecting parts is furthermore enhanced by the protruding tips 35a, 35b.

Note that because the thin-film piezoelectric material element 22 has the lower adhesive film 16a and the upper adhesive film 16b, adhesion of the piezoelectric material film 13 to the lower electrode film 17 and the upper electrode film 27 is enhanced.

Modified Example

Figure 11:
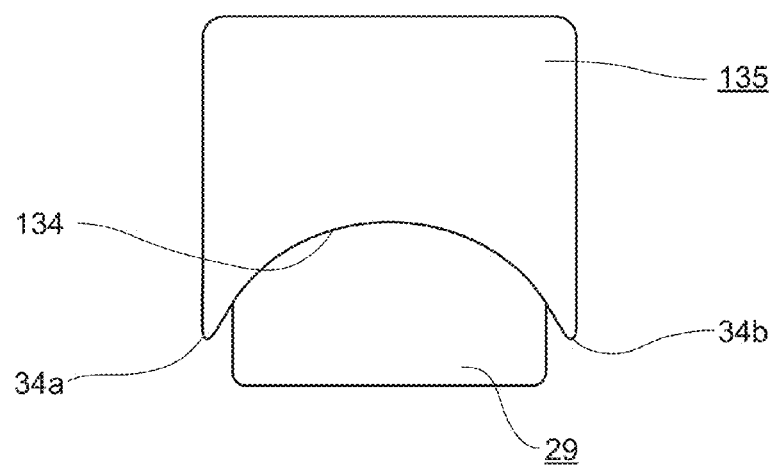
FIG. 11 is a plan view showing the solder regulating parts according to another modified example.

It is possible that the thin-film piezoelectric material element 22 has the solder regulating parts 135 instead of the above-described solder regulating parts 30. The solder regulating parts 135 are different from the solder regulating parts 30 in that the solder regulating parts 135 have the crossing edge parts 134 instead of the crossing edge parts 33, as illustrated in FIG. 11.

The crossing edge parts 134 do not have the flat parts 32 like the crossing edge parts 33, and the crossing edge parts 134 are composed of entirely curved surfaces which connect the outer edge parts 34a with the outer edge parts 34b. The crossing edge parts 134 are also warped in a bow shape with a receding direction from the shortest lines 36, and the crossing edge parts 134 are formed in a bow like curve-shape, similar with the crossing edge parts 33.

Because unevenness of surface density, about the solder applied on the electrode pads 29, does not appear, when the thin-film piezoelectric material element 22 also have the crossing edge parts 134, the fragile phase, in the surfaces of the solders 39, do not appear, and a crack is never formed. Accordingly, reliability of connecting condition, in the solder connecting parts concerning the electrode pads 29 and the electrode pads 6c of the flexure 6, is able to be enhanced, when the thin-film piezoelectric material element 22 also has the solder regulating parts 135.

(Embodiments of Head Gimbal Assembly and Hard Disk Drive)

Next, embodiments of the head gimbal assembly and hard disk drive will now be explained with reference to FIG. 13.

Figure 13:
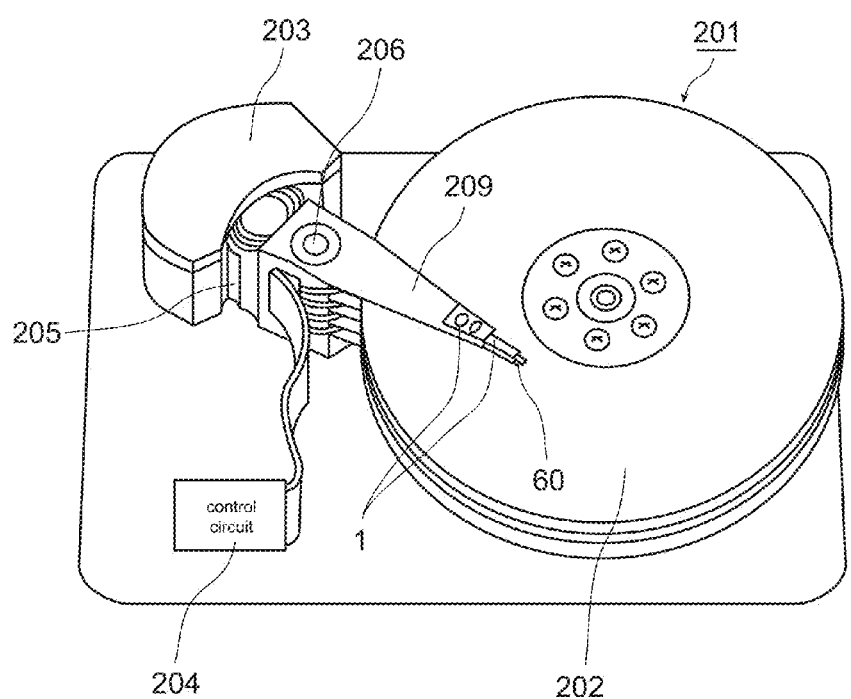
FIG. 13 is a perspective view illustrating a hard disk drive equipped with the HGA according to an embodiment of the present invention.
Figure 14A:
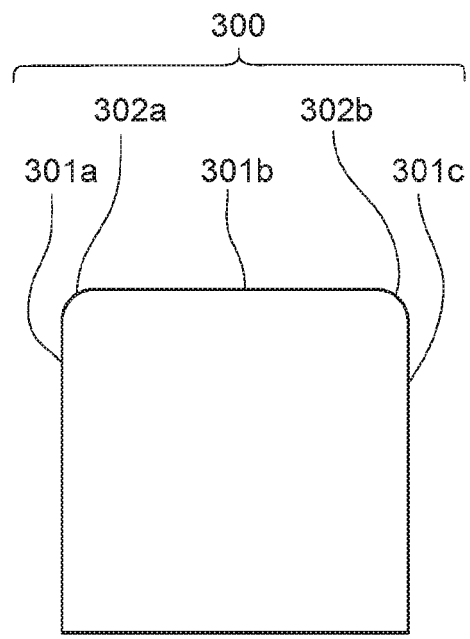
FIG. 14(a) is a plan view showing one example of the conventional regulating parts.
Figure 14B:
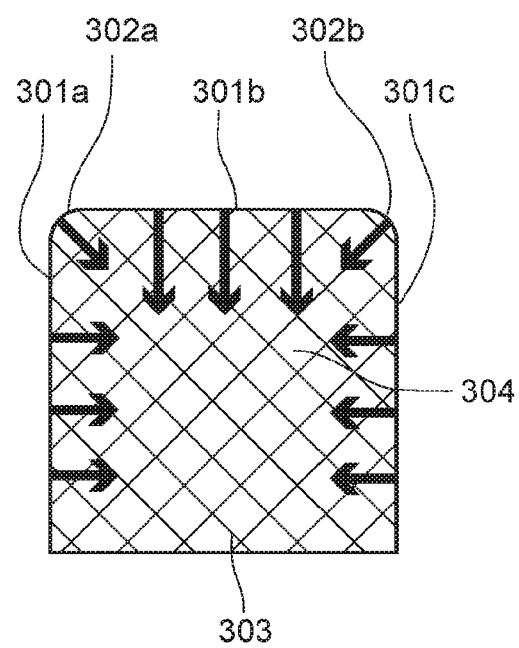
FIG. 14(b) is a plan view schematically showing the movement of the solders when soldering, for the solder regulating parts in FIG. 14(a), is performed.
Figure 15A:
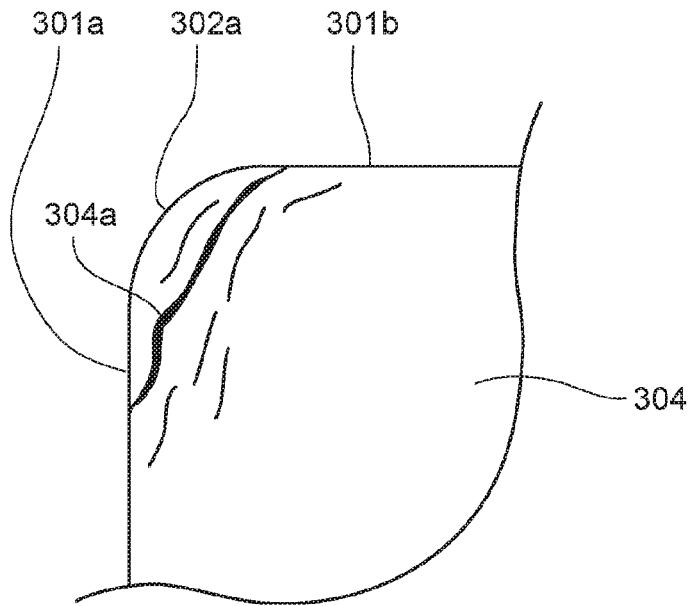
FIG. 15(a) is a plan view showing a principal part of the surface of the conventional solder.
Figure 15B:
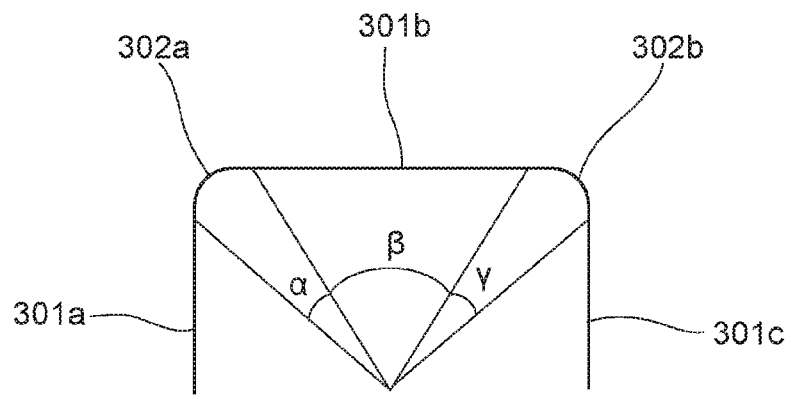
FIG. 15(b) is a plan view showing angles of each part about the regulating parts in FIG. 14(a).

FIG. 13 is a perspective view illustrating a hard disk drive 201 equipped with the above-mentioned HGA 1. The hard disk drive 201 includes a hard disk (magnetic recording medium) 202 rotating at a high speed and the HGA 1. The hard disk drive 201 is an apparatus which actuates the HGA 1, so as to record/reproduce data onto/from recording surfaces of the hard disk 202. The hard disk 202 has a plurality of (4 in the drawing) platters. Each platter has a recording surface opposing its corresponding the head slider 60.

The hard disk drive 201 positions the head slider 60 on a track by an assembly carriage device 203. A thin-film magnetic head, not illustrated, is formed on this head slider 60. Further, the hard disk drive 201 has a plurality of drive arms 209. The drive arms 209 pivot about a pivot bearing shaft 206 by means of a voice coil motor (VCM) 205, and are stacked in a direction along the pivot bearing shaft 206. Further, the HGA 1 is attached to the tip of each drive arm 209.

Further, the hard disk drive 201 has a control circuit 204 controlling recording/reproducing.

In the hard disk drive 201, when the HGA 1 is rotated, the head slider 60 moves in a radial direction of the hard disk 202, i.e., a direction traversing track lines.

In case such HGA 1 and hard disk drive 201 are formed with the above-described thin-film piezoelectric material elements 22, reliability of connecting condition, in the solder connecting parts concerning the electrode pads 29 and the electrode pads 6c of the flexure 6, is able to be enhanced.

The-above description is an explanation about the embodiment of the present invention, and the-above description does not limit apparatus and method according to the present invention. Various modified examples are able to be performed easily. Besides, the present invention includes apparatus and method, being composed of appropriate combination of composition element, function, characteristic, method-step in each embodiment.

Reliability of connecting condition, in the solder connecting parts concerning the electrode pads and the electrode pads of the flexure, is able to be enhanced, in the thin-film piezoelectric material element, by applying the present invention. The present invention is able to be utilized for the thin-film piezoelectric material element and head gimbal assembly, hard disk drive having the thin-film piezoelectric material element.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:
1. A thin-film piezoelectric material element comprising:
a piezoelectric part; and
electrode pads being connected with the piezoelectric part,
wherein the piezoelectric part comprises a laminated structure, of which a lower electrode film, a piezoelectric material film and an upper electrode film are laminated sequentially;
wherein the thin-film piezoelectric material element comprises solder regulating parts formed on pad surfaces, the pad surfaces being surfaces of the electrode pads;
wherein the solder regulating parts comprise a peripheral edge part and two outer edge parts arranged as outermost parts; and crossing edge parts connecting with the two outer edge parts, and formed so as to cross the pad surfaces, the two outer edge parts being edge parts of the solder regulating parts and arranged outside of the pad surfaces, wherein the crossing edge parts are formed in a bow like inward curve-shape having a curved part, being connected with the two outer edge parts and formed as an approximate arc shape.

2. The thin-film piezoelectric material element according to claim 1,
wherein the pad surfaces are formed in approximately rectangular shapes,
wherein the crossing edge parts have a flat part formed along a short-side edge part of the pad surfaces,
wherein the curved part is formed respectively in both sides of the flat part, a length of a portion of the curved part on the pad surfaces is equal or larger than a length of the flat part.

3. The thin-film piezoelectric material element according to claim 2,
wherein the solder regulating parts have protruding tips respectively surrounded by the peripheral edge part, the two outer edge parts and the curved part,
wherein the protruding tips are arranged outside of the pad surfaces, and formed approximately along a long-side edge part of the pad surfaces.

4. The thin-film piezoelectric material element according to claim 1,
wherein the curved part is formed so that a portion of the curved part on the pad surfaces has a radius of curvature less than 100 μm.

5. The thin-film piezoelectric material element according to claim 2,
wherein the peripheral edge part comprises two outside arranged parts formed along a long-side edge part of the pad surfaces and arranged outside of the long-side edge part, and connecting parts which connect the two outside arranged parts, and are formed along the short-side edge part.

6. The thin-film piezoelectric material element according to claim 3,
wherein the peripheral edge part comprises two outside arranged parts formed along the long-side edge part of the pad surfaces and arranged outside of the long-side edge part of the pad surfaces, and connecting parts which connect the two outside arranged parts, and are formed along the short-side edge part.

7. A head gimbal assembly comprising a head slider having a thin-film magnetic head; a suspension for supporting the head slider; and a thin-film piezoelectric material element for displacing the head slider relatively to the suspension;
wherein the thin-film piezoelectric material element comprises:
a piezoelectric part; and
electrode pads being connected with the piezoelectric part,
wherein the piezoelectric part comprises a laminated structure of which a lower electrode film, a piezoelectric material film and an upper electrode film are laminated sequentially;
wherein the thin-film piezoelectric material element comprises solder regulating parts formed on pad surfaces, the pad surfaces being surfaces of the electrode pads;
wherein the solder regulating parts comprise a peripheral edge part and two outer edge parts arranged as outermost parts; and crossing edge parts connecting with the two outer edge parts, and formed so as to cross the pad surfaces, the two outer edge parts being edge parts of the solder regulating parts and arranged outside of the pad surfaces,
wherein the crossing edge parts are formed in a bow like inward curve-shape having a curved part, being connected with the two outer edge parts and formed as an approximate arc shape.

8. A hard disk drive comprising a head gimbal assembly including a head slider having a thin-film magnetic head, a suspension for supporting the head slider, a thin-film piezoelectric material element for displacing the head slider relatively to the suspension; and a recording medium;
wherein the thin-film piezoelectric material element comprises:
a piezoelectric part; and
electrode pads being connected with the piezoelectric part,
wherein the piezoelectric part comprises a laminated structure of which a lower electrode film, a piezoelectric material film and an upper electrode film are laminated sequentially;
wherein the thin-film piezoelectric material element comprises solder regulating parts formed on pad surfaces, the pad surfaces being surfaces of the electrode pads;
wherein the solder regulating parts comprise a peripheral edge part and two outer edge parts arranged as outermost parts; and crossing edge parts connecting with the two outer edge parts, and formed so as to cross the pad surfaces, the two outer edge parts are being edge parts of the solder regulating parts and arranged outside of the pad surfaces,
wherein the crossing edge parts are formed in a bow like inward curve-shape having a curved part, being connected with the two outer edge parts and formed as an approximate arc shape.

* * * * *